United States Patent
Maruyama

(10) Patent No.: US 9,402,314 B2
(45) Date of Patent: Jul. 26, 2016

(54) SEMICONDUCTOR MODULE

(71) Applicant: Murata Manufacturing Co., Ltd., Nagaokakyo-shi, Kyoto-fu (JP)

(72) Inventor: Masashi Maruyama, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 362 days.

(21) Appl. No.: 14/082,414

(22) Filed: Nov. 18, 2013

(65) Prior Publication Data

US 2014/0160693 A1    Jun. 12, 2014

(30) Foreign Application Priority Data

Dec. 11, 2012 (JP) .................................. 2012-270540

(51) Int. Cl.
| | |
|---|---|
| H05K 1/02 | (2006.01) |
| H05K 1/18 | (2006.01) |
| H03F 3/68 | (2006.01) |
| H05K 1/16 | (2006.01) |
| H03F 3/195 | (2006.01) |
| H05K 3/46 | (2006.01) |

(52) U.S. Cl.
CPC ................ *H05K 1/165* (2013.01); *H03F 3/195* (2013.01); *H03F 3/68* (2013.01); *H05K 1/0228* (2013.01); *H03F 2200/111* (2013.01); *H05K 1/0298* (2013.01); *H05K 3/4611* (2013.01); *H05K 2201/09972* (2013.01); *H05K 2201/1003* (2013.01); *H05K 2201/10015* (2013.01); *H05K 2201/10098* (2013.01)

(58) Field of Classification Search
CPC ..... H05K 1/18; H05K 1/0228; H05K 1/0231; H03F 3/68

USPC .......................................................... 361/748
See application file for complete search history.

(56) References Cited

U.S. PATENT DOCUMENTS

| | | | | |
|---|---|---|---|---|
| 7,064,612 B2 * | 6/2006 | Akamine | ............... | H03F 1/0272 330/129 |
| 7,262,480 B2 * | 8/2007 | Kyogoku | ................ | H01F 17/02 257/531 |
| 7,589,589 B2 * | 9/2009 | Kusunoki | ............... | H03F 1/0277 330/124 R |

(Continued)

FOREIGN PATENT DOCUMENTS

| | | |
|---|---|---|
| JP | 2004-281847 A | 10/2004 |
| JP | 2005-123728 A | 5/2005 |

(Continued)

OTHER PUBLICATIONS

Official Communication issued in corresponding Japanese Patent Application No. 2012-270540, mailed on May 12, 2015.

(Continued)

*Primary Examiner* — Jeremy C Norris
*Assistant Examiner* — Nathan Milakovich
(74) *Attorney, Agent, or Firm* — Keating & Bennett, LLP

(57) ABSTRACT

A semiconductor module includes a circuit substrate, a first semiconductor device substrate that is mounted on the circuit substrate and that processes an input signal of a first frequency band, a second semiconductor device substrate that is mounted on the circuit substrate and that processes an input signal of a second frequency band, and a control device substrate that is arranged between the first and second semiconductor device substrates and that controls the first and second semiconductor device substrates.

16 Claims, 5 Drawing Sheets

(56) References Cited

U.S. PATENT DOCUMENTS

| | | | |
|---|---|---|---|
| 8,362,591 B2 * | 1/2013 | Yen | H01L 27/016 257/595 |
| 8,736,378 B1 * | 5/2014 | Hau | H03F 1/0277 330/147 |
| 2006/0103470 A1 | 5/2006 | Kato | |
| 2007/0298736 A1 | 12/2007 | Fujioka et al. | |
| 2008/0125061 A1 | 5/2008 | Kuriyama et al. | |
| 2012/0326780 A1 * | 12/2012 | Balm | H01P 5/185 330/124 R |
| 2014/0312976 A1 | 10/2014 | Noori et al. | |
| 2015/0229283 A1 * | 8/2015 | Kuwata | H03F 1/42 330/250 |
| 2015/0340991 A1 * | 11/2015 | Lin | H03F 1/0205 455/127.1 |

FOREIGN PATENT DOCUMENTS

| | | |
|---|---|---|
| JP | 2006-148268 A | 6/2006 |
| JP | 2007-174100 A | 7/2007 |
| JP | 2008-35487 A | 2/2008 |
| JP | 2008-135822 A | 6/2008 |
| JP | 2014-512152 A | 5/2014 |
| WO | 2012/143748 A1 | 10/2012 |

OTHER PUBLICATIONS

Official Communication issued in corresponding Japanese Patent Application No. 2012-270540, mailed on Oct. 20, 2014.

* cited by examiner

SEMICONDUCTOR MODULE

BACKGROUND OF THE INVENTION

1. Field of the Invention

The present invention relates to semiconductor modules.

2. Description of the Related Art

A plurality of frequency bands may be used in wireless communication standards employed by mobile terminals, such as cellular phones. For example, in Global System for Mobile Communications (GSM) (registered trademark), a low-frequency band (for example, 850 MHz band) and a high-frequency band (for example, 1900 MHz) may be used. In order to form a communication module that supports such a plurality of frequency bands, power amplifier modules adapted to respective frequency bands and a switch are required. Hence, a semiconductor module including a plurality of semiconductor device substrates corresponding to respective frequencies are used (for example, Japanese Unexamined Patent Application Publication No. 2006-148268).

The power amplifier module disclosed in Japanese Unexamined Patent Application Publication No. 2006-148268, which includes two power amplifier circuits for different frequency bands, has a configuration in which control signals for controlling the biases of the power amplifier circuits are supplied from the outside of the power amplifier module. In other words, a control unit needs to be separately provided in addition to the power amplifier module within a communication module as a unit for power amplification, resulting in an increase in the module size.

SUMMARY OF THE INVENTION

In view of the above-described situation, preferred embodiments of the present invention prevent an increase in the size of a communication module that includes a semiconductor module supporting a plurality of frequency bands.

A semiconductor module according to a preferred embodiment of the present invention includes a circuit substrate; a first semiconductor device substrate that is mounted on the circuit substrate and that processes an input signal of a first frequency band; a second semiconductor device substrate that is mounted on the circuit substrate and that processes an input signal of a second frequency band; and a control device substrate that is arranged between the first and second semiconductor device substrates and that controls the first and second semiconductor device substrates mounted on the circuit substrate.

According to a preferred embodiment of the present invention, it is possible to prevent an increase in the size of a communication module including a semiconductor module that supports a plurality of frequency bands.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
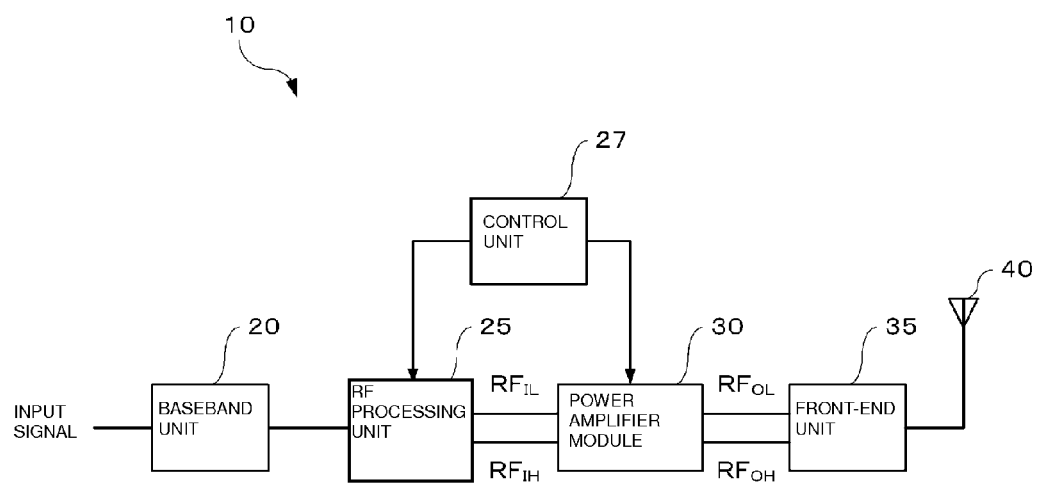
FIG. 1 is a diagram illustrating an example of the configuration of a transmission unit including a power amplifier module, which is a preferred embodiment of the present invention.

Hereinafter, preferred embodiments of the present invention will be described with reference to the attached drawings. FIG. 1 is a diagram illustrating an example configuration of a transmission unit including a power amplifier module, which is a preferred embodiment of the present invention. A transmission unit 10 is preferably used, for example, in a mobile communication apparatus, such as a cellular phone, to transmit various signals, such as voice and data, to a base station. Note that although the mobile communication apparatus includes a receiver unit arranged to receive a signal from the base station, description thereof is omitted here.

Referring to FIG. 1, the transmission unit 10 includes a baseband unit 20, an RF processing unit 25, a control unit 27, a power amplifier module 30, a front-end unit 35, and an antenna 40.

The baseband unit 20 converts an input signal into an IQ signal and outputs the IQ signal. The RF processing unit 25 modulates an input signal using a modulation method such as HSUPA or LTE and generates a high-frequency (RF) signal for wireless transmission. The frequency of the RF signal ranges roughly from several hundred megahertz to several gigahertz, for example.

In the present preferred embodiment, the RF processing unit 25 supports dual bands and can perform modulation in a low-frequency band (for example, 850 MHz band) and a high-frequency band (for example, 1900 MHz band). In other words, the RF processing unit 25, under the control of the control unit 27, can output a low-frequency band RF signal ($RF_{IL}$) and a high-frequency band RF signal ($RF_{IH}$).

The power amplifier module 30, under the control of the control unit 27, amplifies the power of an RF signal ($RF_{IL}$/$RF_{IH}$) to a level that is sufficient for transmission to a base station and outputs an amplified signal ($RF_{OL}$/$RF_{OH}$).

The front-end unit 35 performs filtering for an amplified signal, switching between a transmission signal and a reception signal received from a base station, and the like. An amplified signal output from the front-end unit 35 is transmitted through the antenna 40 to a base station.

Figure 2:
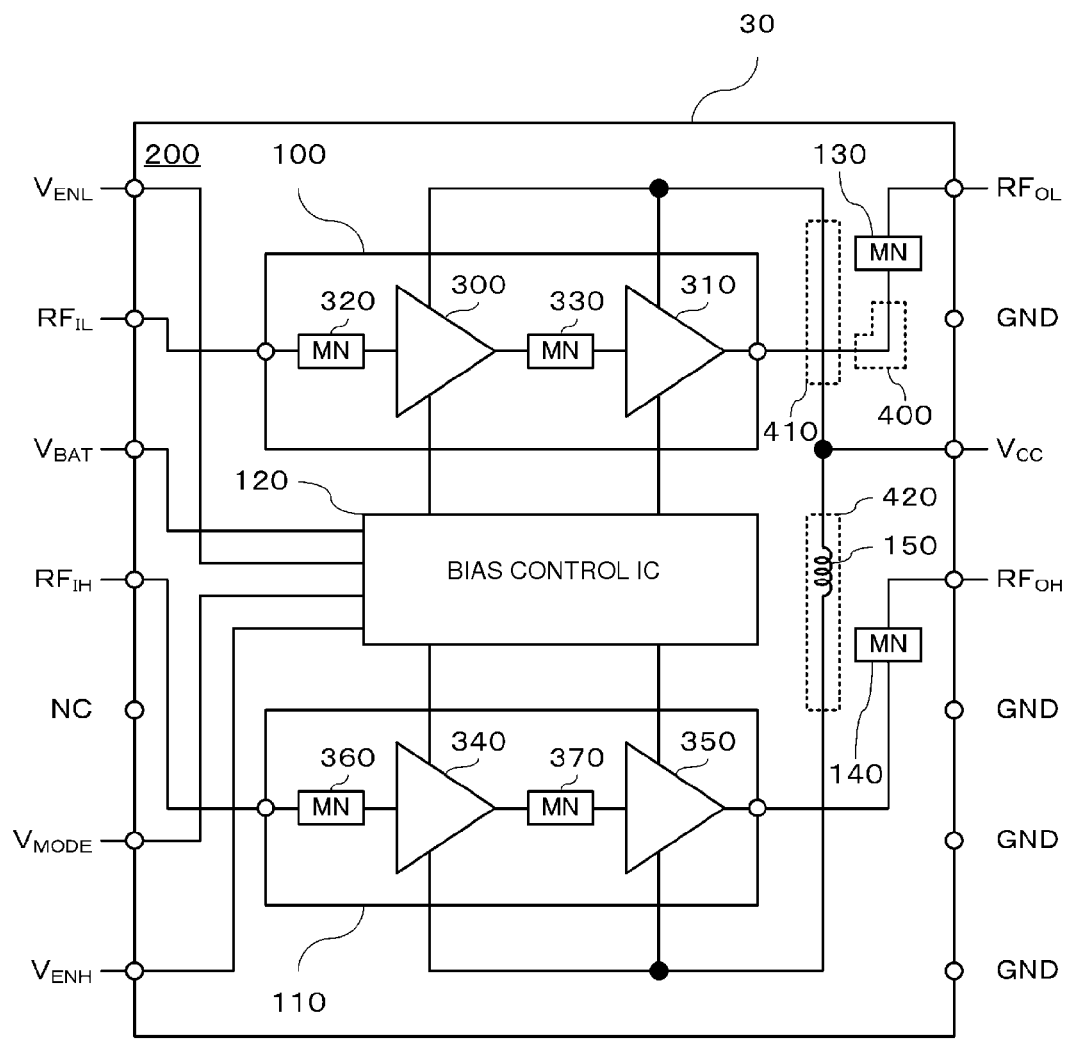
FIG. 2 is a diagram illustrating an example of the configuration of the power amplifier module.

FIG. 2 is a diagram illustrating an example configuration of the power amplifier module 30. Referring to FIG. 2, the power amplifier module 30 has a configuration in which components including a power amplifier circuit 100 for a low-frequency band, a power amplifier circuit 110 for a high-frequency band, a bias control integrated circuit (IC) 120, matching circuits 130 and 140, and a coil 150 are mounted on a circuit substrate 200. In the present preferred embodiment, the circuit substrate 200 is a multilayer substrate. Note that the circuit substrate 200 may be of any type and maybe, for example, a resin substrate or a ceramic substrate.

The power amplifier circuit 100 is a semiconductor device substrate configured to be able to amplify an RF signal ($RF_{IL}$) in a low-frequency band (for example, 850 MHz band). The power amplifier circuit 100 is mounted on the circuit substrate 200 using a wire bonding or flip-chip mounting method.

The power amplifier circuit 100 includes, for example, power amplifiers 300 and 310 and matching circuits 320 and 330. The power amplifiers 300 and 310 define a two-stage amplifier circuit which amplifies the power of an input signal using bias voltages supplied from the bias control IC 120. The matching circuits 320 and 330 are provided to respectively perform impedance matching between the prior stage on the input terminal side and the power amplifier 300 and between the prior stage on the input terminal side and the power amplifier 310. Note that in the configuration illustrated in FIG. 2, although the number of stages of the power amplifier in the power amplifier circuit 100 is two, for example, the number of stages is not limited to this and may be one, or three or more.

The power amplifier circuit 110 is a semiconductor device substrate configured to be able to amplify an RF signal ($RF_{IH}$) in a high-frequency band (for example, 1900 MHz band). The power amplifier circuit 110 is mounted on the circuit substrate 200 using a wire bonding or flip-chip mounting method.

The power amplifier circuit 110 includes, for example, power amplifiers 340 and 350 and matching circuits 360 and 370. The power amplifiers 340 and 350 define a two-stage amplifier circuit which amplifies the power of an input signal using bias voltages supplied from the bias control IC 120. The matching circuits 360 and 370 are provided to respectively perform impedance matching between the prior stage on the input terminal side and the power amplifier 340 and between the prior stage on the input terminal side and the power amplifier 350. Note that in the configuration illustrated in FIG. 2, although the number of stages of the power amplifier in the power amplifier circuit 110 is two, for example, the number of stages is not limited to this and may be one, or three or more. Further, the power amplifier circuit 110 may include the bias control IC 120 and the power amplifier circuit 100.

The bias control IC 120 supplies a bias voltage to the power amplifier circuits 100 and 110 using a battery voltage $V_{BAT}$. Specifically, the bias control IC 120 supplies a bias voltage to the power amplifier circuit 100 when a voltage $V_{ENL}$ is at one level (for example, a high level), and does not supply the bias voltage to the power amplifier circuit 100 when the voltage $V_{ENL}$ is at the other level (for example, a low level). Similarly, the bias control IC 120 supplies a bias voltage to the power amplifier circuit 110 when a voltage $V_{ENH}$ is at one level (for example, a high level), and does not supply the bias voltage to the power amplifier circuit 110 when the voltage $V_{ENH}$ is at the other level (for example, a low level).

The bias control IC 120 can switch the output level of the power amplifier circuits 100 and 110 on the basis of a voltage $V_{MODE}$. Specifically, the bias control IC 120 can control the level of a bias voltage in such a manner that the output level of the power amplifier circuits 100 and 110 is made high when the voltage $V_{MODE}$ is at one level (for example, a high level) and the output level of the power amplifier circuits 100 and 110 is made low when the voltage $V_{MODE}$ is at the other level (for example, a low level).

A matching circuit 130, which is connected to the output terminal of the power amplifier circuit 100, performs impedance matching between the output of the power amplifier circuit 100 and a circuit in a subsequent stage connected to a terminal $RF_{OL}$ and preferably includes, for example, a coil and a capacitor. Similarly, a matching circuit 140, which is connected to the output terminal of the power amplifier circuit 110, performs impedance matching between the output of the power amplifier circuit 110 and a circuit in a subsequent stage connected to a terminal $RF_{OH}$ and preferably includes, for example, a coil and a capacitor.

The coil 150 is provided to realize a high impedance for a power supply that supplies a voltage $V_{CC}$. The coil 150 is preferably formed, for example, by mounting an air-core coil on the surface of the circuit substrate 200.

Wiring portions 400 and 410 connected to the power amplifier circuit 100 include helical or substantially helical wiring lines extending across a plurality of layers of the multilayer substrate in the circuit substrate 200, and this will be described in detail later. This is to reduce or prevent the influence of a magnetic field generated by the coil 150 which defines a wiring portion 420 connected to the power amplifier circuit 110.

Figure 3:
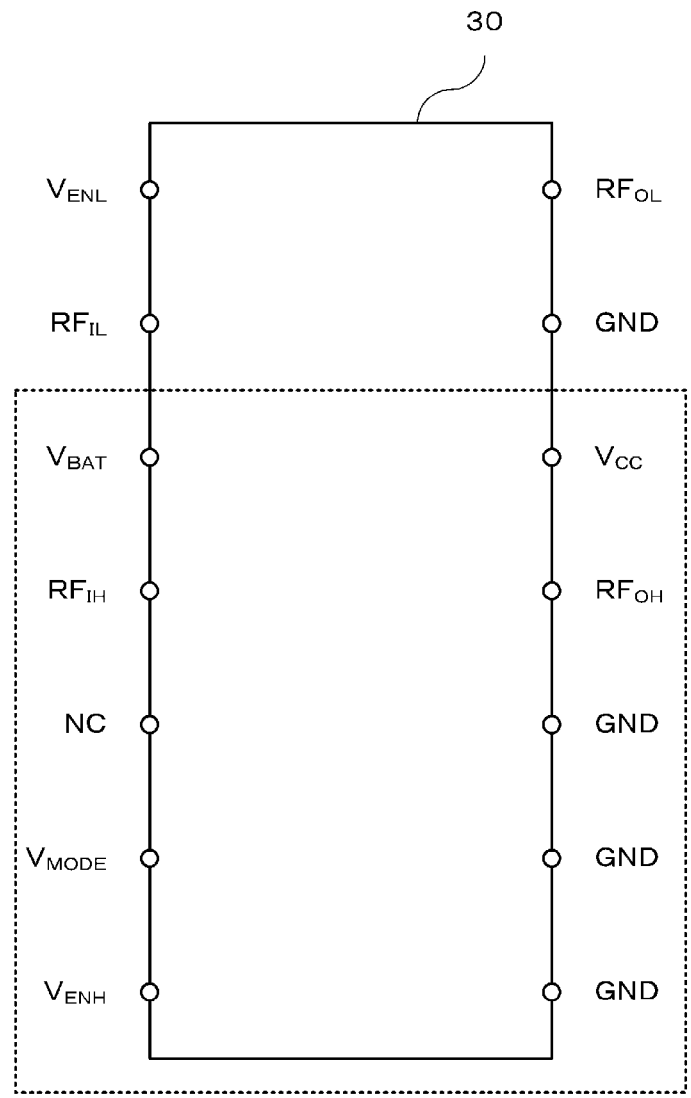
FIG. 3 is diagram illustrating an example of the terminal arrangement of the power amplifier module.
Figure 4:
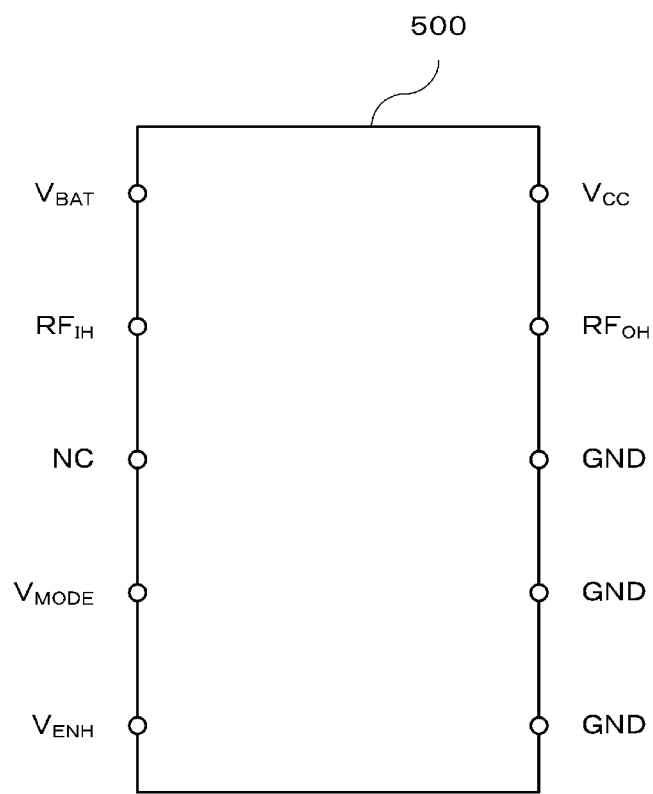
FIG. 4 is a diagram illustrating an example of the terminal arrangement of a single-band power amplifier module.

FIG. 3 is a diagram illustrating an example of the terminal arrangement of the power amplifier module 30. The terminals within a region surrounded by a dotted line in FIG. 3 are terminals used for the operation of the power amplifier circuit 110 which is included in the power amplifier module 30. In other words, in the power amplifier module 30, the terminals used for the operations of the power amplifier circuit 110 are sequentially provided and the same number of terminals are provided on the right and left sides in FIG. 3. Further, the arrangement of these terminals can be made the same as the terminal arrangement of a power amplifier module 500 illustrated in FIG. 4, which performs high-frequency band power amplification equivalent to that of the power amplifier circuit 110, i.e., a single-band power amplifier module 500.

As a result of using the same terminal arrangement in this manner, the power amplifier module 30 can be used by utilizing the wiring layout of a transmission unit in which the power amplifier module 500 is used. Hence, time required for layout adjustment and characteristics adjustment is significantly reduced and an increase in cost is prevented.

Further, in the power amplifier module 30, the circuit layout of the power amplifier circuit 100 can be made to be a circuit layout which is obtained by substantially reversing (mirror-reversing) the circuit layout of the power amplifier circuit 110 with respect to the bias control IC 120. As a result, a circuit layout equivalent to that of the power amplifier circuit 110 used in the power amplifier module 500 can be applied to the power amplifier circuit 100 of the power amplifier module 30. In other words, performance assured in the power amplifier module 500 can be applied not only to the power amplifier circuit 110 but also to the power amplifier circuit 100, as assured performance.

Figure 5:
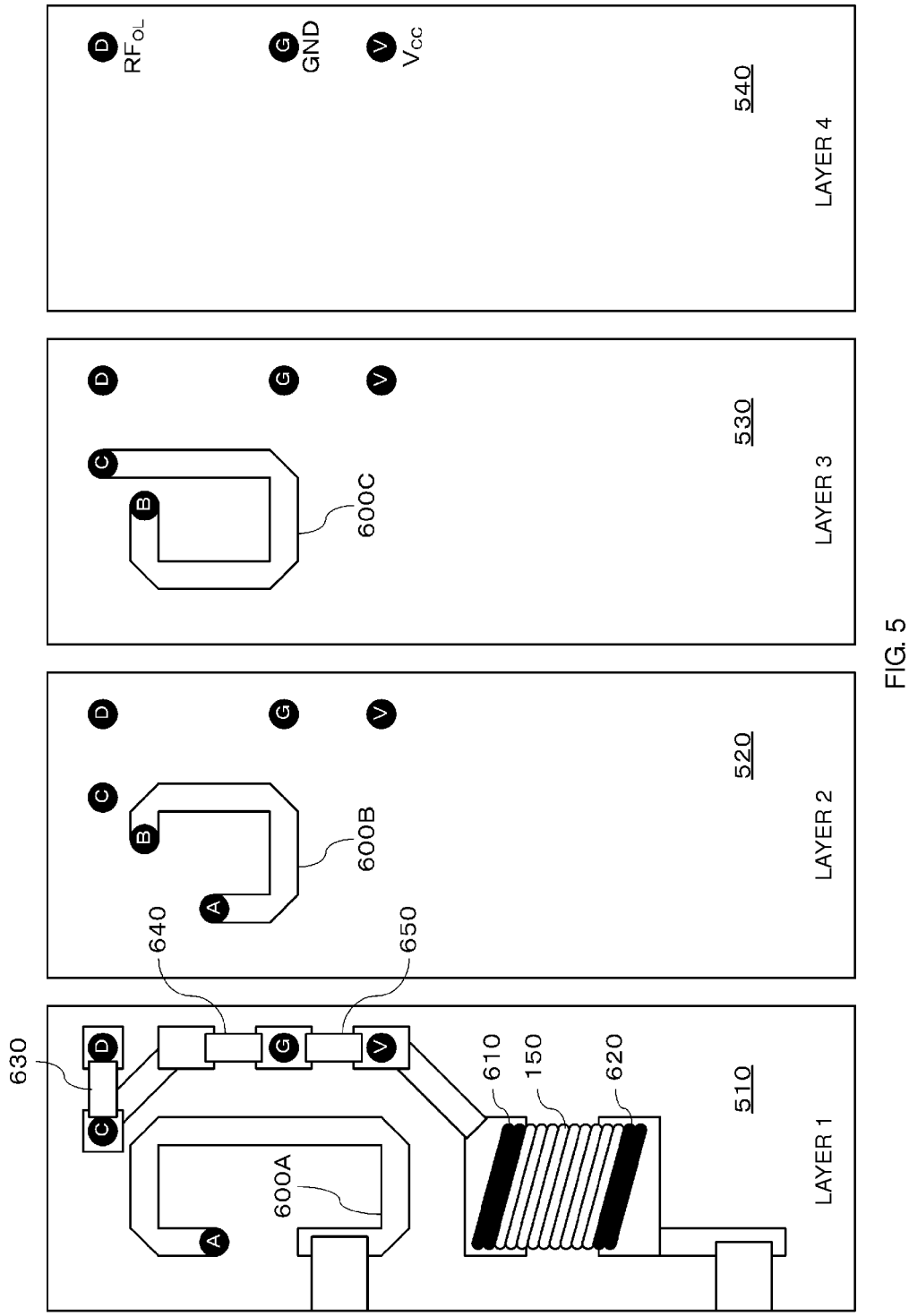
FIG. 5 is a diagram illustrating an example of the configuration of wiring in a circuit substrate.

FIG. 5 is a diagram illustrating an example configuration of wiring in the circuit substrate 200. Note that the wiring illustrated in FIG. 5 schematically represents a portion of the layout of wiring in the circuit substrate 200 and, hence, does not represent the exact layout of the wiring.

In the example illustrated in FIG. 5, the circuit substrate 200 preferably is a multilayer substrate that includes four layers of substrates 510, 520, 530, and 540. Note that, in FIG. 5, points denoted by alphabetical characters illustrate interlayer connection relationship. For example, a point A on the first layer 510 and a point A on the second layer 520 are connected to each other between the first layer 510 and the second layer 520.

In FIG. 5, wiring lines 600A, 600B, and 600C are portions of wiring lines through which an output signal of the power amplifier circuit 100 flows. For example, the wiring lines 600A, 600B, and 600C define the wiring portion 400 illustrated in FIG. 2. As illustrated in FIG. 5, the wiring lines 600A, 600B, and 600C extend across the first layer 510, the second layer 520, and the third layer 530, in a helical or substantially helical shape. In other words, a portion of the wiring portion 400 has a helical or substantially helical shape which extends in the depth direction of the circuit substrate 200 so as to be wound around an axis parallel or substantially parallel with the stacking direction of the circuit substrate 200.

On the other hand, as illustrated in FIG. 5, the coil 150 is mounted on the surface of the first layer 510. For example, the coil 150 defines the wiring portion 420 illustrated in FIG. 2. In other words, a portion of the wiring portion 420 has a helical or substantially helical shape arranged such that a line member defining the coil 150 is wound around an axis which is parallel or substantially parallel with the main surface of the circuit substrate 200.

In this manner, in the circuit substrate 200, the wiring lines 600A, 600B, and 600C are arranged to generate a magnetic field which is perpendicular or substantially perpendicular to a magnetic field generated by the coil 150. As a result, leakage of a signal between a high-frequency band and a low-frequency band is significantly reduced or prevented.

Note that, although not illustrated in FIG. 5, the wiring portion 410, which is a portion of a wiring line that supplies power to the power amplifier circuit 100, may include a wiring line having a helical or substantially helical shape that extends in the depth direction of the circuit substrate 200, similarly to the wiring portion 400.

Further, by arranging coils and wiring electrodes such that a magnetic field generated by a coil which defines the matching circuit 140 connected to the output terminal of the power amplifier circuit 110 is perpendicular or substantially perpendicular to a magnetic field generated by the wiring portion 400 and a coil which defines the matching circuit 130 connected the output terminal of the power amplifier circuit 100, interference between a high-frequency-band side circuit including the power amplifier circuit 110 and a low-frequency-band side circuit including the power amplifier circuit 100 is significantly reduced, such that the characteristics of the power amplifier module is greatly enhanced.

In the present preferred embodiment, the coil 150 preferably is an air-core coil which is defined by winding a line member whose surface is covered by an insulating film (for example, polyethylene film) in a helical or substantially helical shape. Line member portions corresponding to a plurality of turns at two ends 610 and 620 of the coil 150 are exposed and not covered by the insulating film. The line member portions of each of the exposed portions are electrically connected to one another laterally using solder plating or the like, such the exposed portions define the electrodes of the coil 150. The exposed portions of the two ends 610 and 620 may each include about two to three turns, for example. By electrically connecting the line member portions to one another laterally using solder plating or the like at the two ends 610 and 620 of the coil 150, a magnetic field generated by the coil 150 is significantly reduced.

In the circuit substrate 200, chip capacitors 630 and 640 that define the low-frequency band matching circuit 130 and a chip capacitor 650 defining the high-frequency band matching circuit 140 are provided on the first layer 510. Here, as illustrated in FIG. 5, the chip capacitor 640 for the low-frequency band and the chip capacitor 650 for the high-frequency band are mounted on the first layer 510 such that a ground potential (GND) is provided between the chip capacitor 640 and the chip capacitor 650. By using a configuration in which a common electrode to which one terminal of the chip capacitor 640 and one terminal of the chip capacitor 650 are connected is arranged between the two terminals and the ground potential (GND) is supplied to the common electrode, even when a signal leaks from a high-frequency band side to a low-frequency band side or vice versa, the signal is guided to the ground electrode and, hence, interference between the low-frequency band circuit and the high-frequency band circuit is significantly reduced or prevented.

Note that in the present preferred embodiment, although the ground potential preferably is supplied to the common electrode, an electrode to which the ground potential is supplied may be arranged separately for each chip capacitor.

Further, by providing a third electrode which is not connected to the terminals of the chip capacitors, the ground potential may be supplied to this electrode.

The transmission unit 10 including the power amplifier module 30 of the present preferred embodiment has been described above. According to the present preferred embodiment, since the power amplifier module 30 includes therein the bias control IC 120, an increase in the size of the transmission unit 10 and infiltration of noise is prevented or significantly reduced compared with the case in which the bias control IC is provided outside of the power amplifier module. Further, since the bias control IC 120 is arranged between the power amplifier circuits 100 and 110 in the power amplifier module 30, distances between the bias control IC 120 and the power amplifier circuits 100 and 110 are small, such that infiltration of noise through the wiring lines is significantly reduced or prevented.

According to the present preferred embodiment, the low-frequency-band matching circuit 130 and the high-frequency band matching circuit 140 are preferably arranged on the same side (the right side in FIG. 2) on the circuit substrate 200. As a result, the matching circuits 130 and 140 can be efficiently designed on the circuit substrate 200.

In the present preferred embodiment, wiring is arranged in such a manner that a magnetic field generated from a portion of a low-frequency band wiring line is perpendicular or substantially perpendicular to a magnetic field generated from a portion of a high-frequency band wiring line. Specifically, by making the low-frequency band wiring portions 400 and 410 have a helical or substantially helical shape with its axis in the depth direction of the circuit substrate 200, and making the coil 150 have a helical or substantially helical shape with its axis in the plane direction of the circuit substrate 200, leakage of a signal between the low-frequency band and the high-frequency band is significantly reduced or prevented.

In the present preferred embodiment, the line member at each of the two ends 610 and 620 of an air-core coil defining the coil 150 is exposed and not covered by an insulating film and the line member pieces of each of the exposed portions are connected to one another laterally using solder plating or the like. As a result, a magnetic field generated by the coil 150 is reduced.

In the present preferred embodiment, a configuration is preferably used in which a common electrode to which one terminal of the chip capacitor 640 defining the matching circuit 130 and one terminal of the chip capacitor 650 defining the matching circuit 140 are connected is arranged between the two terminals and the ground potential (GND) is supplied to the common electrode. As a result, even when a signal leaks from a high-frequency band side to a low-frequency band side or vice versa, the signal is guided to the ground electrode and, hence, interference between a low-frequency band and a high-frequency band is significantly reduced or prevented.

In the present preferred embodiment, the arrangement of terminals for a high-frequency band in the power amplifier module is preferably the same as the terminal arrangement of the single-band power amplifier module 500. As a result, the power amplifier module 30 can be used by utilizing the wiring layout of a transmission unit in which the single-band power amplifier module 500 is used. Hence, time required for layout adjustment and characteristics adjustment when the power amplifier module 30 is used is significantly reduced and an increase in cost is prevented.

In the present preferred embodiment, the circuit layout of the power amplifier circuit 100 can be made to be a circuit layout which is obtained by substantially reversing (mirror-reversing) the circuit layout of the power amplifier circuit 110 with respect to the bias control IC 120. As a result, for example, performance assured in the power amplifier module 500 can be also applied to the power amplifier circuit 100, as assured performance.

Note that the present preferred embodiments have been described to facilitate understanding of the present invention and is not meant to limit the interpretation of the present invention. The present invention can be modified or improved within the scope of the present invention and includes the equivalents of the present invention.

For example, although a power amplifier module has been described as a semiconductor module supporting a plurality of frequency bands in the present preferred embodiment, the semiconductor module is not limited to this. For example, the semiconductor module may be a switch module that includes a first switch device supporting a first frequency band, a second switch device supporting a second frequency band, and a control device arranged and programmed to control the first and second switch devices.

For example, although it is assumed that only a single control device is provided to control biases of the power amplifier circuits 100 and 110 in the present preferred embodiment, control devices for bias control may be provided individually for the power amplifier circuits 100 and 110. In this case, for example, two control devices can be arranged next to each other in the vertical direction in a location where the bias control IC 120 is arranged in FIG. 2.

For example, although the circuit substrate preferably is a multilayer substrate in the present preferred embodiment, the circuit substrate may be a single-layer substrate, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor module comprising:
   a circuit substrate;
   a first semiconductor device substrate that is mounted on the circuit substrate and that processes an input signal of a first frequency band;
   a second semiconductor device substrate that is mounted on the circuit substrate and that processes an input signal of a second frequency band; and
   a control device substrate that is arranged between the first and second semiconductor device substrates and that controls the first and second semiconductor device substrates;
   a first matching circuit that is mounted on the circuit substrate and that is provided between the first semiconductor substrate and an outside of the semiconductor module; and
   a second matching circuit that is mounted on the circuit substrate and that is provided between the second semiconductor substrate and the outside of the semiconductor module; wherein
   the first and second matching circuits are arranged on a same side on the circuit substrate; and
   a common electrode that is connected between a terminal of a capacitor of the first matching circuit and a terminal of a capacitor of the second matching circuit is connected to a ground potential.

2. The semiconductor module according to claim 1, wherein
   the first and second semiconductor device substrates each include an input terminal and an output terminal;
   the first matching circuit is arranged to connect the output terminal of the first semiconductor substrate to a terminal that is connected to the outside of the semiconductor module; and
   the second matching circuit is arranged to connect the output terminal of the second semiconductor substrate to a terminal that is connected to the outside of the semiconductor module.

3. The semiconductor module according to claim 1, wherein first and second wiring lines are arranged such that a magnetic field generated by the first wiring line connected to the first semiconductor substrate is perpendicular or substantially perpendicular to a magnetic field generated by the second wiring line connected to the second semiconductor substrate.

4. The semiconductor module according to claim 3, wherein
   the circuit substrate is a multilayer substrate;
   the first wiring line includes a helical or substantially helical wiring line extending across a plurality of layers of the multilayer substrate; and
   the second wiring line includes a coil located on a surface of the multilayer substrate.

5. The semiconductor module according to claim 4, wherein the coil includes a line member whose surface is covered by an insulating film, the line member is exposed and is not covered by the insulating film over a plurality of turns at each end of the coil, pieces of the line member corresponding to the plurality of turns at each of the exposed portions are electrically connected laterally to one another, and the line member is wound around an axis that is parallel or substantially parallel with a main surface of the circuit substrate.

6. The semiconductor module according to claim 1, wherein a circuit layout of the first semiconductor substrate is a circuit layout that is a substantially mirror-reverse circuit layout of the second semiconductor substrate with respect to the control device substrate.

7. The semiconductor module according to claim 1, wherein the circuit substrate is one of a multilayer substrate and a single-layer substrate.

8. The semiconductor module according to claim 1, wherein each of the first and second semiconductor device substrates is a power amplifier circuit.

9. The semiconductor module according to claim 8, wherein each of the power amplifier circuits includes power amplifiers that define a two-stage amplifier circuit.

10. The semiconductor module according to claim 1, wherein the control device includes a bias control integrated circuit arranged to supply a bias voltage to the first and second semiconductor device substrates.

11. The semiconductor module according to claim 4, wherein the coil is an air-core coil.

12. The semiconductor module according to claim 1, wherein the capacitor of the first matching circuit and the capacitor of the second matching circuit are chip capacitors mounted on the circuit substrate.

13. The semiconductor module according to claim 12, further comprising a ground between the chip capacitors.

14. A transmission unit comprising:
   a baseband unit;
   an RF processing unit;
   an antenna;
   a front end unit; and
   a power amplifier module defined by the semiconductor module according to claim 1.

15. A communication apparatus comprising the transmission unit according to claim 14.

16. A communication apparatus comprising the semiconductor module according to claim 9.

\* \* \* \* \*